United States Patent
Chen et al.

(10) Patent No.: US 12,255,186 B2
(45) Date of Patent: Mar. 18, 2025

(54) SPLICING DISPLAY DEVICE

(71) Applicant: TCL CHINA STAR OPTOELECTRONICS TECHNOLOGY CO., LTD., Guangdong (CN)

(72) Inventors: Yao Chen, Guangdong (CN); Min Wang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,486

(22) PCT Filed: Nov. 19, 2021

(86) PCT No.: PCT/CN2021/131760
§ 371 (c)(1),
(2) Date: Dec. 12, 2021

(87) PCT Pub. No.: WO2023/082308
PCT Pub. Date: May 19, 2023

(65) Prior Publication Data
US 2024/0014184 A1   Jan. 11, 2024

(30) Foreign Application Priority Data
Nov. 15, 2021   (CN) .......................... 202111345650.6

(51) Int. Cl.
*H01L 25/075*   (2006.01)
*H05K 1/18*   (2006.01)

(52) U.S. Cl.
CPC ......... *H01L 25/0753* (2013.01); *H05K 1/189* (2013.01); *H05K 2201/10128* (2013.01)

(58) Field of Classification Search
CPC ........ G09F 9/33; G09F 9/3023; G09F 9/3026; H01L 25/0753; H05K 1/189; H05K 2201/10128
See application file for complete search history.

(56) References Cited

U.S. PATENT DOCUMENTS

2016/0267860 A1   9/2016   Liu et al.
2017/0249119 A1*  8/2017   Ding .......................... G09F 9/33
(Continued)

FOREIGN PATENT DOCUMENTS

CN   202615763 U   12/2012
CN   104464557 A    3/2015
(Continued)

OTHER PUBLICATIONS

KR20150069145A Merged translation (Year: 2015).*
(Continued)

*Primary Examiner* — Mary A Wilczewski
*Assistant Examiner* — Nathan Pridemore
(74) *Attorney, Agent, or Firm* — PV IP PC; Wei Te Chung

(57) ABSTRACT

The present application provides a splicing display device. The splicing display device includes at least two display devices, a middle frame and a light emitting diode (LED) substrate. Each two adjacent display devices are spliced to form a gap. The display device includes a backplate and is arranged on the backplate. The middle frame includes a support part and a fixing part connected to the support part, the support part is arranged on the two panels and covers the gap. The fixing part is arranged in the gap and is detachably connected to the backplate. The LED substrate is arranged on the support part.

9 Claims, 5 Drawing Sheets

(56) References Cited

U.S. PATENT DOCUMENTS

| | | |
|---|---|---|
| 2018/0173036 A1 | 6/2018 | Kim et al. |
| 2019/0058081 A1 | 2/2019 | Ahmed et al. |

FOREIGN PATENT DOCUMENTS

| | | | |
|---|---|---|---|
| CN | 105845036 A | | 8/2016 |
| CN | 106842711 A | | 6/2017 |
| CN | 106972045 A | | 7/2017 |
| CN | 207199233 U | | 4/2018 |
| CN | 108205970 A | | 6/2018 |
| CN | 110444124 A | | 11/2019 |
| CN | 111290154 A | | 6/2020 |
| CN | 211149981 U | | 7/2020 |
| JP | 2001159874 A | | 6/2001 |
| JP | 2007192977 A | | 8/2007 |
| JP | 2018522255 A | | 8/2018 |
| KR | 20150069145 A | * | 6/2015 |
| WO | 2021169554 A1 | | 9/2021 |
| WO | 2021189433 A1 | | 9/2021 |

OTHER PUBLICATIONS

Chinese Office Action issued in corresponding Chinese Patent Application No. 202111345650.6 dated Jun. 6, 2022, pp. 1-10.

International Search Report in International application No. PCT/CN2021/131760, mailed on Aug. 11, 2022.

Written Opinion of the International Searching Authority in International application No. PCT/CN2021/131760, mailed on Aug. 11, 2022.

Chinese Office Action issued in corresponding Chinese Patent Application No. 202111345650.6 dated Nov. 11, 2022, pp. 1-5.

Chinese Office Action issued in corresponding Chinese Patent Application No. 202111345650.6 dated Feb. 4, 2023, pp. 1-7.

Japanese Office Action issued in corresponding Japanese Patent Application No. 特願2021-570214 dated Jan. 29, 2024, pp. 1-5.

* cited by examiner

SPLICING DISPLAY DEVICE

FIELD OF DISCLOSURE

The present application relates to a field of display technology and in particular, to a splicing display device.

DESCRIPTION OF RELATED ART

There is an increasing demand for splicing panels on the market, and LCD splicing panels occupy the medium and low-end markets due to price advantages. In the high-end market, light emitting diode (LED) splicing panels with small splicing seams are the mainstream products. Splicing seams are a main bottleneck which impedes liquid crystal display (LCD) splicing panels entering high-end products. The development of zero-seam LCD splicing products can enhance product competitiveness and seize opportunities on high-end market for indoor LED splicing panels, such as applications in broadcasting media and big data centers.

During research and implementation processes of the prior art, the inventor of the present application found that in conventional LCD splicing panels, LED substrates are directly attached at seams, so it is not easy to detach the LED substrates in a subsequent process.

SUMMARY

The present application provides a splicing display device, which facilitates detachment of a light emitting diode (LED) substrate.

The present application provides a splicing display device, comprising:
  at least two display devices, wherein two adjacent display devices are spliced to form a gap, and each of the display devices comprises a backplate and a panel disposed on the backplate;
  a middle frame, wherein the middle frame comprises a carrying part and a fixing part connected to the carrying part, the carrying part is arranged on two adjacent panels and covers the gap, and the fixing part is arranged in the gap and detachably connected to the backplate; and
  a light emitting diode (LED) substrate, wherein the LED substrate is arranged on the carrying part;
  wherein the splicing display device further comprises a flexible circuit board, the flexible circuit board is connected to one side of the LED substrate facing the gap, an opening is defined in the carrying part, and the flexible circuit board passes through the opening and is disposed in the gap;
  wherein the LED substrate covers the carrying part, and an edge portion of the LED substrate protrudes beyond the carrying part.

Optionally, in some embodiments of the present application, the panel comprises a display area and a non-display area disposed on a periphery of the display area, and the non-display area comprises a non-bonding area and a bonding area for bonding a circuit board; and
  the carrying part comprises a first portion and a second portion, the first portion is arranged in the bonding area, the second portion is arranged in the non-bonding area, and a width of the first portion is greater than a width of the second portion.

Optionally, in some embodiments of the present application, the opening is defined in the first part, and the flexible circuit board is located on one side of the fixing part close to the bonding area.

Optionally, in some embodiments of the present application, the backplate comprises a base and a first surrounding wall connected on a periphery of the base, the base and the first surrounding wall define a receiving chamber, a limiting recess and a first hole are defined in the first surrounding wall, and the first hole is defined in a bottom of the limiting recess; and
  the fixing part comprises a plate body and a groove body protruding from the plate body, a second hole is defined in the groove body, the groove body is disposed in the limiting recess, the groove body and the backplate are detachably connected by a connection element, and the connection element is inserted through the first hole and the second hole.

Optionally, in some embodiments of the present application, the connection element comprises a nut and a stud connected to the nut, the nut is arranged in a recessed groove defined by the groove body, and the stud is threadedly connected to the first hole.

Optionally, in some embodiments of the present application, the panel is disposed in the receiving chamber of the backplate, and the panel is an LED panel.

Optionally, in some embodiments of the present application, a thickness of the carrying part is less than a thickness of the fixing part.

The present application relates to another splicing display device, comprising:
  at least two display devices, wherein two adjacent display devices are spliced to form a gap, and each of the display devices comprises a backplate and a panel disposed on the backplate;
  a middle frame, wherein the middle frame comprises a carrying part and a fixing part connected to the carrying part, the carrying part is arranged on two adjacent panels and covers the gap, and the fixing part is arranged in the gap and detachably connected to the backplate; and
  a light emitting diode (LED) substrate, wherein the LED substrate is arranged on the carrying part.

The present embodiment not only uses the middle frame to protect the panels, but also uses the middle frame as a base for supporting the LED substrate. The middle frame and the backlight module of the display device are detachably connected, and the LED substrate is also arranged on the carrying part of the middle frame. Therefore, by just detaching the middle frame, the LED substrate are separated from the panels, which reduces difficulty in detaching the LED substrate.

Optionally, in some embodiments of the present application, the splicing display device further comprises a flexible circuit board, the flexible circuit board is connected to one side of the LED substrate facing the gap, an opening is defined in the carrying part, and the flexible circuit board passes through the opening and is disposed in the gap.

Through the opening defined in the carrying part, the flexible circuit board can pass through the carrying part and enter the gap. Such configuration avoids the flexible circuit board from going around an outer surface of the carrying part to enter the gap, thereby saving layout space, and shortening a length of the flexible circuit board.

Optionally, in some embodiments of the present application, the panel comprises a display area and a non-display area disposed on a periphery of the display area, and the non-display area comprises a non-bonding area and a bonding area for bonding a circuit board; and
  the carrying part comprises a first portion and a second portion, the first portion is arranged in the bonding area, the second portion is arranged in the non-bonding area, and a width of the first portion is greater than a width of the second portion.

In splicing the two display devices, the bonding area of the non-display area is at one side of the gap, and the non-bonding area is at another side of the gap. A width of the bonding area is greater than a width of the non-bonding area. Therefore, by designing the width of the first portion to be greater than the width of the second portion, the carrying part can better shield the non-display area, and better support the LED substrate.

Optionally, in some embodiments of the present application, the opening is defined in the first part, and the flexible circuit board is located on one side of the fixing part close to the bonding area.

The bonding area is used to bond a flip chip or a non-flip chip circuit board, and the flexible circuit board is arranged on one side close to the bonding area, so that both the flexible circuit board and the circuit board bonded in the bonding area can connect to a driving board, which simplifies connection steps and saves installation space.

Optionally, in some embodiments of the present application, the backplate comprises a base and a first surrounding wall connected on a periphery of the base, the base and the first surrounding wall define a receiving chamber, a limiting recess and a first hole are defined in the first surrounding wall, and the first hole is defined in a bottom of the limiting recess; and the fixing part comprises a plate body and a groove body protruding from the plate body, a second hole is defined in the groove body, the groove body is disposed in the limiting recess, the groove body and the backplate are detachably connected by a connection element, and the connection element is inserted through the first hole and the second hole.

The groove body of the fixing part and the limiting recess of the backplate cooperate to improve accuracy and convenience of assembling. In addition to that, a detachable connection between the middle frame and the backplate is realized by using the connection element.

Optionally, in some embodiments of the present application, the connection element comprises a nut and a stud connected to the nut, the nut is arranged in a recessed groove defined by the groove body, and the stud is threadedly connected to the first hole.

By arranging the nut in the recessed groove defined by the groove body, the present application saves assembly space. By using the stud threadedly connected to the first hole, the present application avoids unnecessary use of nuts, reduces difficulty in connection, and saves materials.

Optionally, in some embodiments of the present application, the panel is disposed in the receiving chamber of the backplate, and the panel is an LED panel.

Optionally, in some embodiments of the present application, the display device comprises a backlight module arranged on a light incident side of the panel, the backlight module comprises the backplate and a support frame, the support frame is arranged in the receiving chamber, and the support frame is fixedly connected to the backplate;

the support frame comprises a second surrounding wall, a support plate, a third surrounding wall, and a connecting wall, the second surrounding wall is arranged inside and along a periphery of the receiving chamber, the support plate is protrudingly disposed on an opposite side of the second surrounding wall, the third surrounding wall surrounds around the support plate and arranged on the first surrounding wall, the connecting wall is disposed corresponding to the bonding area and extends from the third surrounding wall to the base, and the connecting wall is located on an outer side with respect to the first surrounding wall; and the second surrounding wall is engaged with the first surrounding wall, and the connecting wall is engaged with the first surrounding wall. Such configuration realizes the connection between the support frame and the backplate, and improves the convenience of the connection between the support frame and the backplate.

Optionally, in some embodiments of the present application, the second surrounding wall comprises a first wall and a second wall that are arranged opposite to each other, and the first wall is located on one side away from the bonding area, and the first wall, the first surrounding wall, and the support plate define a first space; and the second wall, the first surrounding wall, and the support plate define a second space.

The first space and the second space facilitate heat dissipation of the backlight module on the one hand, and facilitates installing electrical components and the like in the first space and/or the second space on the other hand.

Optionally, in some embodiments of the present application, the second surrounding wall further comprises a third wall and a fourth wall that are arranged opposite to each other, and the third wall is connected at one side of the first wall, the fourth wall is connected at another side of the first wall and the second wall, and the third wall and the fourth wall are engaged with the first surrounding wall. Such configuration realizes a detachable connection between the backplate and the support frame.

Optionally, in some embodiments of the present application, the backlight module further comprises a light source, a diffuser plate, and an optical film, and the light source is arranged in the receiving chamber; and the support plate and the third surrounding wall are connected to form a receiving groove, the diffuser plate is disposed in the receiving groove, and the optical film is disposed on the third surrounding wall and located on a light emitting side of the diffuser plate. Such configuration reasonably arranges optical components and improves a utilization rate of space.

Optionally, in some embodiments of the present application, a thickness of the carrying part is less than a thickness of the fixing part.

The less thickness of the carrying part makes the LED substrate disposed on the panel not visually obtrusive. The greater thickness of the fixing part improves stability in the connection between the support frame and the backplate.

Optionally, in some embodiments of the present application, the LED substrate shields the carrying part, and an edge portion of the LED substrate protrudes beyond the carrying part.

The LED substrate and the carrying part are both arranged in the non-display area. The LED substrate shields and protrudes beyond the carrying part. Such configuration reduces a risk that the carrying part is saw in a side view angle and improves the display performance.

Advantages of the present application: The splicing display device of the present application comprises at least two display devices, a middle frame, and an LED substrate. Each two adjacent display devices are spliced to form a gap. Each display device comprises a backlight module and a panel arranged on the backlight module. The middle frame comprises a carrying part and a fixing part connected to the carrying part. The carrying part is arranged on two adjacent panels and covers the gap. The fixing part is arranged in the gap and is detachably connected to the backlight module. The LED substrate is disposed on the carrying part.

That is to say, the present application not only uses the middle frame to protect the panel, but also uses the middle frame as a base for supporting the LED substrate. The middle frame and the backplate of the display device are detachably connected, and the LED substrate is arranged on the carrying part of the middle frame. Therefore, by just detaching the middle frame, the LED substrate can be separated from the panel at the same time, which reduces the difficulty in detaching the LED substrate.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
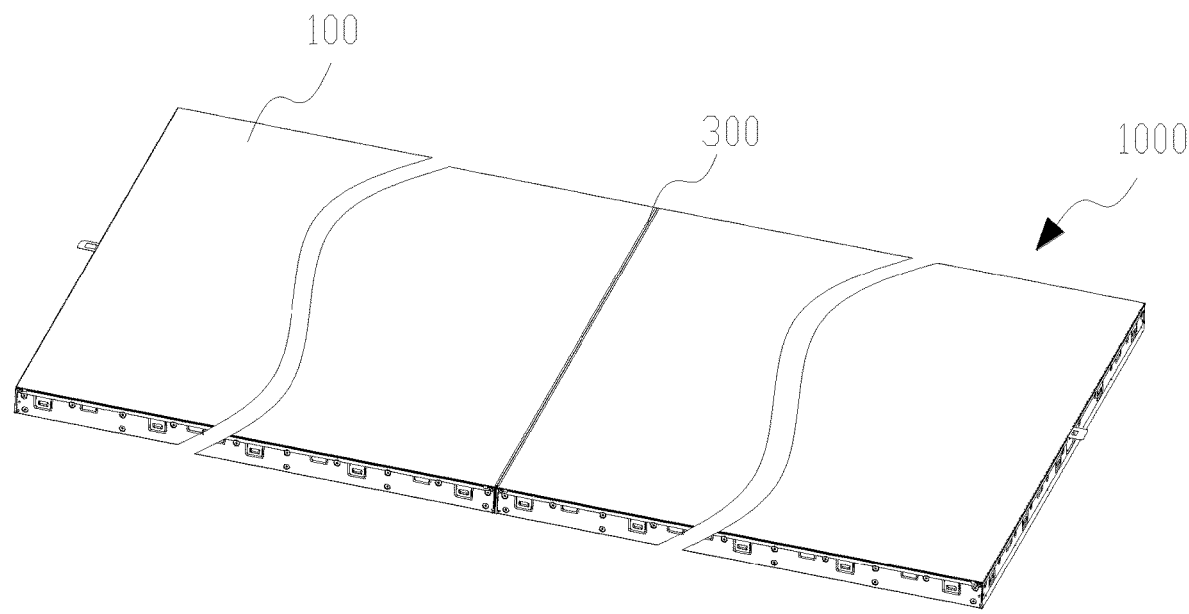
FIG. 1 is a schematic structural view illustrating a splicing display device according to one embodiment of the present application.

The technical solutions in the present application will be clearly and completely described below in conjunction with accompanying drawings and with reference to specific embodiments. Obviously, the embodiments are only some of the embodiments of the present application, rather than all the embodiments. Based on the embodiments in the present application, all other embodiments obtained by those skilled in the art without creative work shall fall within the protection scope of the present application. In addition, it should be understood that the specific embodiments described here are only used to illustrate and explain the present application, and are not used to limit the present application. In the present application, unless otherwise specified, directional terms such as "upper" and "lower" generally refer to the upper and lower directions of a device in actual use or work state, and specifically refer to the directions in the drawings. The terms "inner" and "outer" are referred to with reference to outlines of the device.

The present application provides a splicing display device. Detailed descriptions are provided below. It should be noted that an order of descriptions in the following embodiments is not intended to limit a preferred order of the embodiments.

It should be noted that, in the present application, the display device 100 is a liquid crystal display device as an example for description, but the present application is not limited in this regard. For example, in the present application, the panel can also be a light emitting diode (LED) panel, such as a micro-LED panel, a mini-LED panel, an organic LED panel, or a quantum dot LED panel.

When the panel is an LED panel, the panel is placed in the receiving chamber rn of the backplate 111. The backplate 111 and a connection structure between the backplate 111 and a middle frame are described below, and a detailed description is omitted herein.

Figure 2:
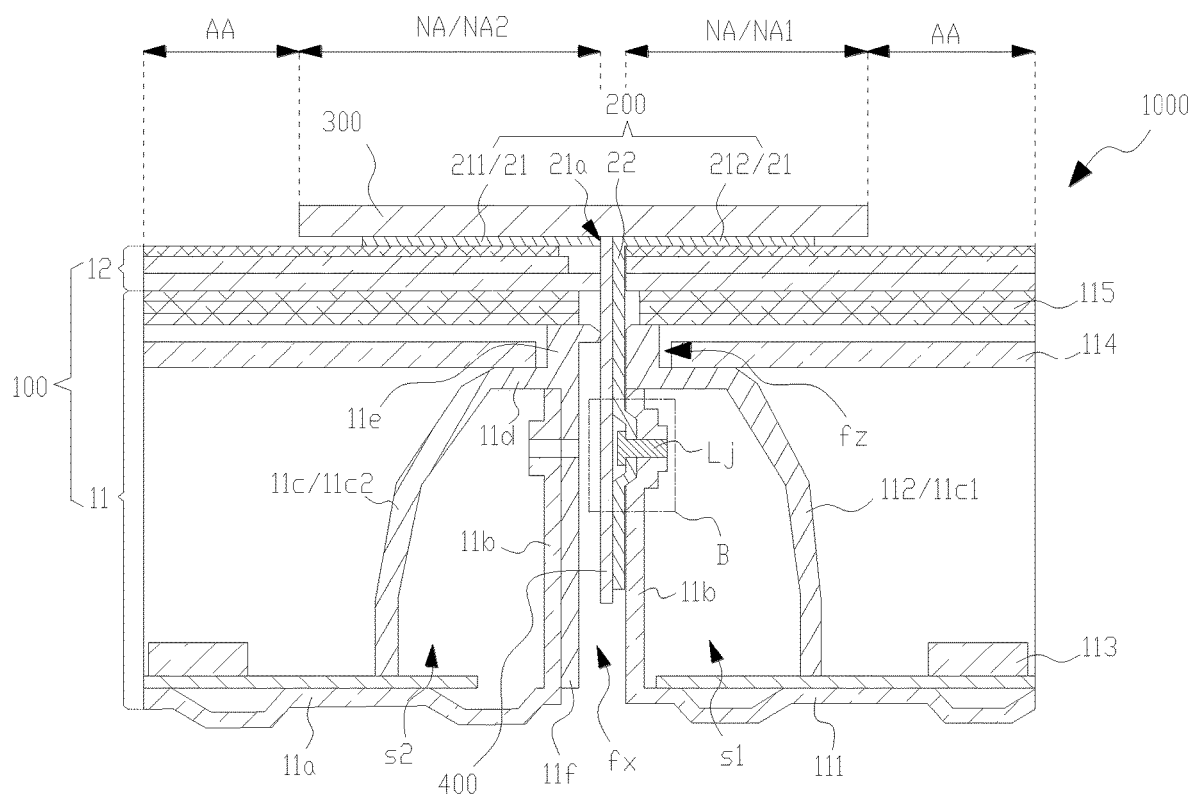
FIG. 2 is a partial cross-sectional view illustrating the splicing display device according to one embodiment of the present application.

Please refer to FIG. 1 and FIG. 2. The present application provides a splicing display device 1000. The splicing display device comprises at least two display devices 100, a middle frame 200, and a light emitting diode (LED) substrate 300.

Each two adjacent display devices 100 are spliced to form a gap fx. Each display device 100 comprises a backplate 111 and a panel 12 disposed on the backplate 111.

Figure 3:
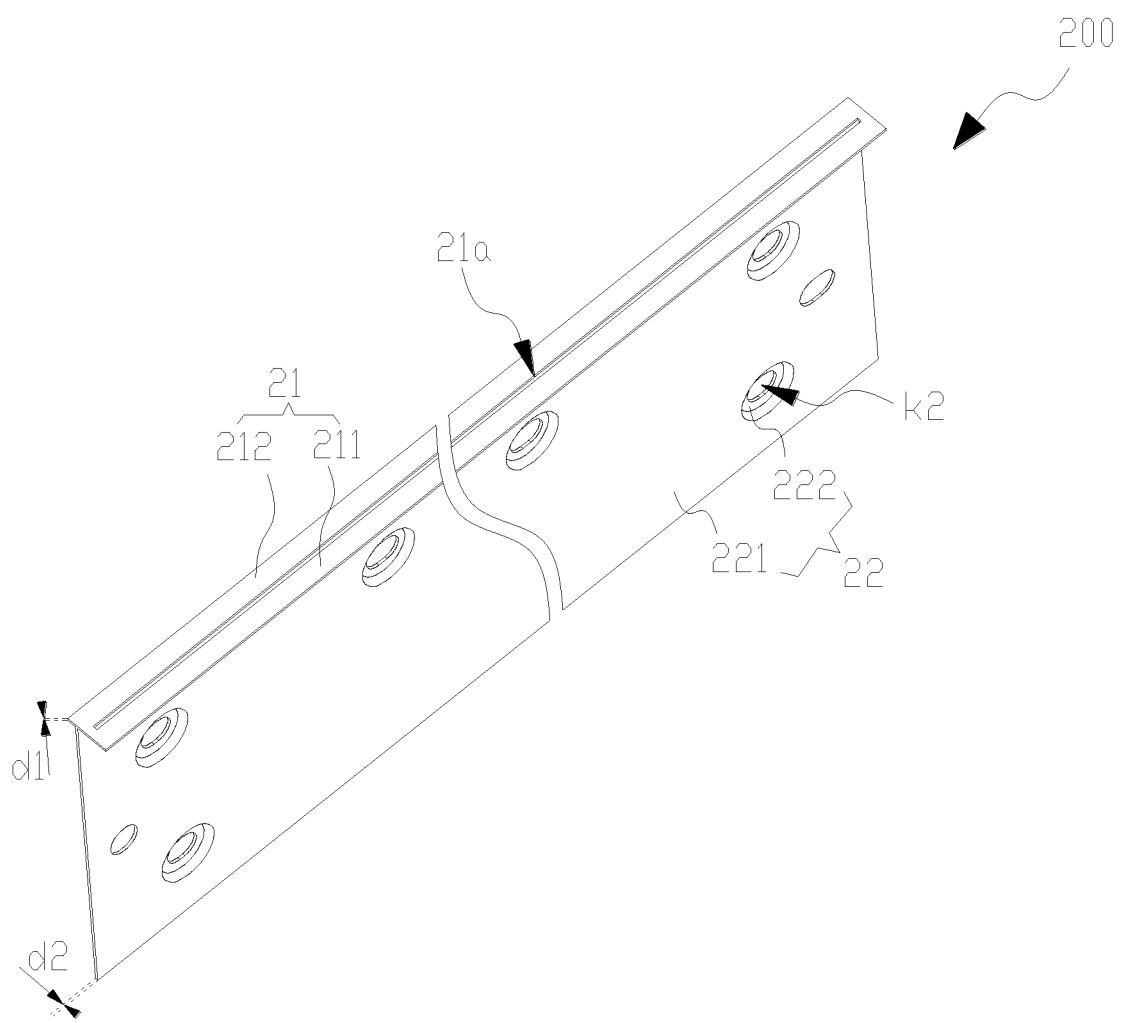
FIG. 3 is a schematic structural view illustrating a middle frame of the splicing display device according to one embodiment of the present application.

With reference to FIG. 3, the middle frame 200 comprises a carrying part 21 and a fixing part 22 connected to the carrying part 21. The carrying part 21 is arranged on two adjacent panels 12 and shields the gap fx. The fixing part 22 is arranged in the gap fx and is detachably connected to the backplate 111.

The LED substrate 300 is disposed on the carrying part 21.

The display device 100 comprises a backlight module 11 disposed on a light incident side of the panel 12. The backlight module 11 comprises a backplate 111.

The splicing display device 1000 of the present embodiment not only uses the middle frame 200 to protect the panels 12, but also uses the middle frame 200 as a base for supporting the LED substrate 300. The middle frame 200 and the backlight module 11 of the display device 100 are detachably connected, and the LED substrate 300 is also arranged on the carrying part 21 of the middle frame 200. Therefore, by just detaching the middle frame 200, the LED substrate 300 are separated from the panels 12, which reduces the difficulty in detaching the LED substrate 300.

Optionally, the LED substrate 300 can be an inorganic LED substrate or an organic light-emitting diode (OLED) substrate like a micro-LED substrate, a mini-LED substrate, or a quantum dot light-emitting diode (QLED) substrate.

Optionally, the splicing display device 1000 further comprises a flexible circuit board 400. The flexible circuit board 400 is connected to one side of the LED substrate 300 facing the gap fx. An opening 21a is defined in the carrying part 21. The flexible circuit board 400 passes through the opening 21a and is disposed in the gap fx.

Through the opening 21a defined in the carrying part 21, the flexible circuit board 400 can pass through the carrying part 21 and enter the gap fx. Such configuration avoids the flexible circuit board 400 from going around an outer surface of the carrying part 21 to enter the gap fx, thereby reducing a height of the LED substrate 300, saving layout space, and shortening a length of the flexible circuit board 400.

In some embodiments, the carrying part 21 can have no openings. In this case, the flexible circuit board 400 is bonded to a side or a front of the LED substrate 300, and the flexible circuit board 400 extends around the outer surface of the carrying part 21 to enter the gap fx.

Optionally, a thickness d1 of the carrying part 21 is less than a thickness d2 of the fixing part 22.

The less thickness of the carrying part 21 makes the LED substrate 300 disposed on the panel 12 not visually obtrusive. The greater thickness of the fixing part 22 improves stability in the connection between the support frame 112 and the backplate 111.

Optionally, the LED substrate 300 shields the carrying part 21, and an edge portion of the LED substrate 300 protrudes beyond the carrying part 21.

The LED substrate 300 and the carrying part 21 are both arranged in the non-display area NA. The LED substrate 300 shields and protrudes beyond the carrying part 21. Such configuration reduces a risk that the carrying part 21 is saw in a side view angle and improves the display performance.

Optionally, the panel 12 comprises a display area AA and a non-display area NA arranged on a periphery of the display area AA. The non-display area NA comprises a non-bonding area NA1 and a bonding area NA2 for bonding a circuit board.

With reference to FIGS. 2 and 3, the carrying part 21 comprises a first portion 211 and a second portion 212. The first portion 211 is disposed on the bonding area NA2. The second portion 212 is arranged on the non-bonding area NA1. A width of the first portion 211 is greater than a width of the second portion 212.

In splicing the two display devices 100, the bonding area NA2 of the non-display area NA is at one side of the gap fx, and the non-bonding area NA1 is at another side of the gap fx. A width of the bonding area NA2 is greater than a width of the non-bonding area NA1. Therefore, by designing the width of the first portion 211 to be greater than the width of the second portion 212, the carrying part 21 can better shield the non-display area NA, and better support the LED substrate 300.

Optionally, the opening 21a is defined in the first part 211 and corresponding to the gap fx. The flexible circuit board 400 is located at one side of the fixing part 22 close to the bonding area NA2.

The bonding area NA2 is used to bond a flip chip or a non-flip chip circuit board, and the flexible circuit board 400 is arranged on one side close to the bonding area NA2, so that both the flexible circuit board 400 and the circuit board bonded in the bonding area NA2 can connect to a driving board, which simplifies connection steps and saves installation space.

Figure 4:
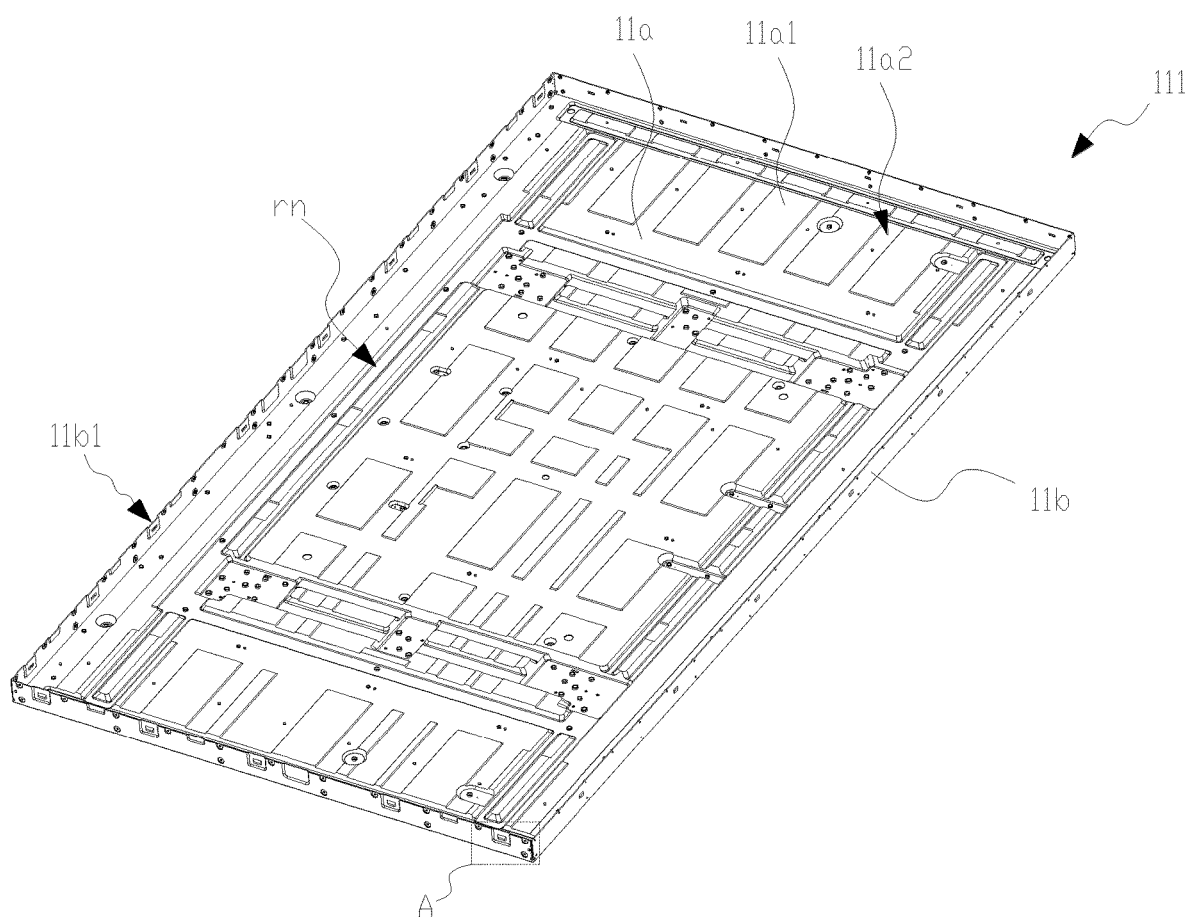
FIG. 4 is a schematic structural view illustrating a backplate of the splicing display device according to one embodiment of the present application.
Figure 5:
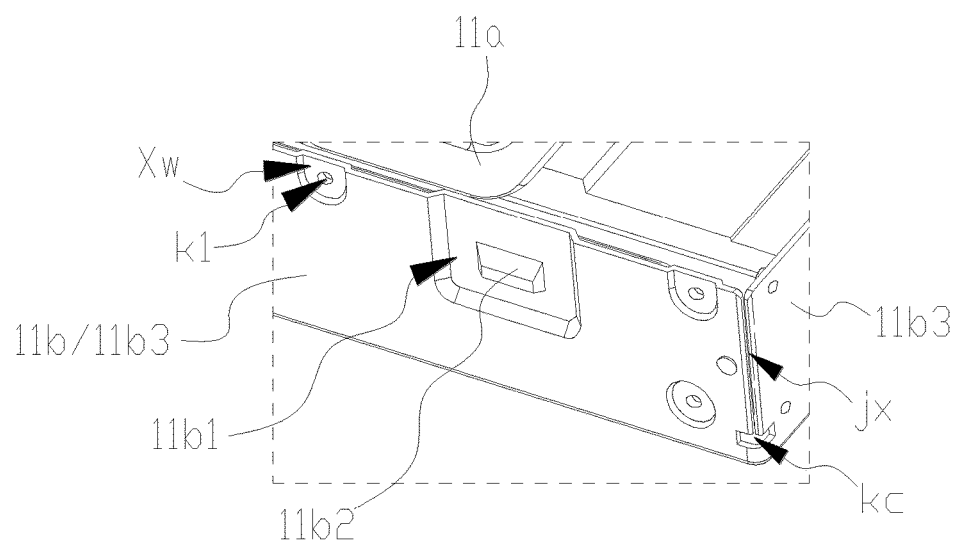
FIG. 5 is an enlarged view of part A in FIG. 4.

Optionally, referring to FIG. 4 and FIG. 5, the backlight module 11 comprises the backplate 111. The backplate 111 comprises a base 11a and a first surrounding wall 11b connected to a periphery of the base 11a. The base 11a and the first surrounding wall 11b define a receiving chamber rn. A limiting recess Xw and a first hole k1 are defined in the first surrounding wall 11b. The first hole k1 is defined in a bottom of the limiting recess Xw.

With reference to FIGS. 2 and 3, the fixing part 22 comprises a plate body 221 and a groove body 222 protruding from the plate body 221. A second hole k2 is defined in the groove body 222. The groove body 222 is disposed in the limiting recess Xw. The groove body 222 and the backplate 111 are detachably connected by means of a connection element Lj. The connection member Lj is inserted through the first hole k1 and the second hole k2.

The groove body 222 of the fixing part 22 and the limiting recess Xw of the backplate 111 cooperate to improve accuracy and convenience of assembling. In addition to that, a detachable connection between the middle frame 200 and the backplate 111 is realized by using the connection element Lj.

Figure 6:
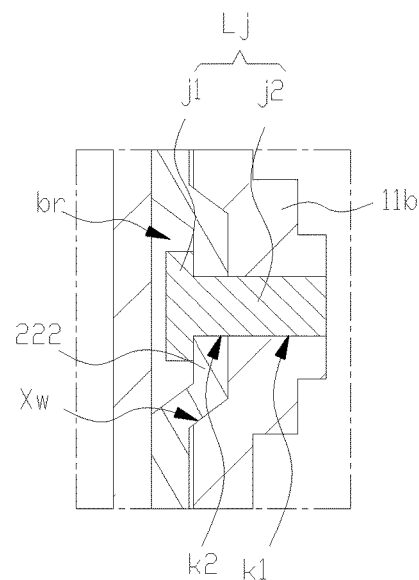
FIG. 6 is an enlarged view of part B in FIG. 2.

Please refer to FIG. 6. Optionally, the connection element Lj comprises a nut j1 and a stud j2 connected to the nut j1.

The nut j1 is arranged in a recessed groove br defined by the groove body 222. The stud j2 is threadedly connected to the first hole k1.

By arranging the nut j1 in the recessed groove br defined by the groove body 222, the present application saves assembly space. By using the stud j2 threadedly connected to the first hole k1, the present application avoids unnecessary use of nuts, reduces the difficulty in connection, and saves materials.

In some embodiments, the connection element Lj can be a plug-in element, and the plug-in element is insertedly fitted into the first hole k1.

Optionally, please continue to refer to FIG. 4, a plurality of platforms 11a1 protrudes from the base 11a. The platforms 11a1 are used to place light boards. A plurality of heat dissipation grooves 11a2 are defined between the platforms 11a1 to facilitate heat dissipation of the light boards (a light source 113).

Optionally, please continue to refer to FIG. 5, an engagement groove 11b1 is defined in the first surrounding wall 11b, and an engagement block 11b2 is disposed in the engagement groove 11b1. By arranging the engagement block 11b2 in the engagement groove 11b1, the present application saves space for arranging the engagement block 11b2. The engagement block 11b2 is used for engagement with an engagement lug 11g of the support frame 112. The engagement lug 11g is arranged in the engagement groove 11b1.

The first surrounding wall 11b comprises a side wall 11b3, and a plurality of side walls 11b3 are arranged on side edges of the base 11a in a one-to-one correspondence. An interval jx and an expansion port kc are defined between two adjacent side walls 11b3. The interval jx and the expansion port kc communicate and separate the two adjacent side walls 11b3, so as to improve adaptability of the first surrounding wall 11b and prevent the first surrounding wall 11b from being squeezed.

In addition, the expansion port kc is located at one side of the gap jx close to the base 11a, and the expansion port kc extends from the gap jx to the two adjacent side walls 11b3 to form a bottom space. When the two adjacent side walls 11b3 are squeezed outwards, the expansion port kc has a buffer effect, reducing a risk of a bottom of the side walls 11b3 being torn.

Optionally, the display device 100 comprises the backlight module 11 disposed on the light incident side of the panel 12. The backlight module 11 comprises the backplate 111 and the support frame 112. The support frame 112 is arranged in the receiving chamber rn. The support frame 112 is fixedly connected to the backplate 111.

Figure 7:
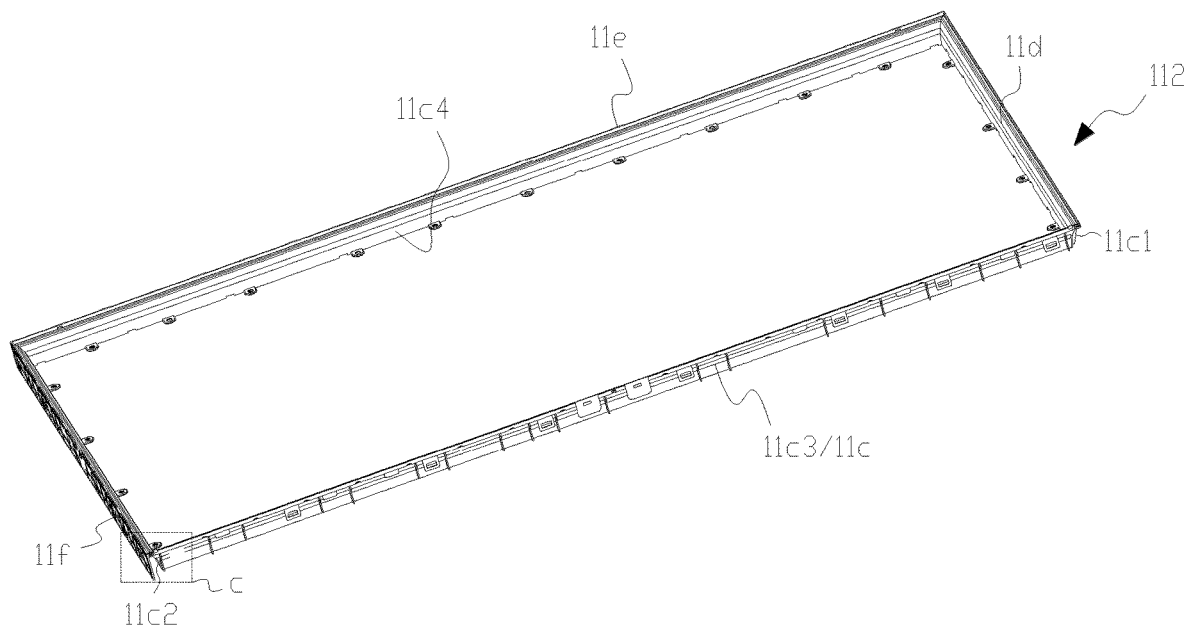
FIG. 7 is a schematic structural view illustrating a support frame of the splicing display device according to one embodiment of the present application.
Figure 8:
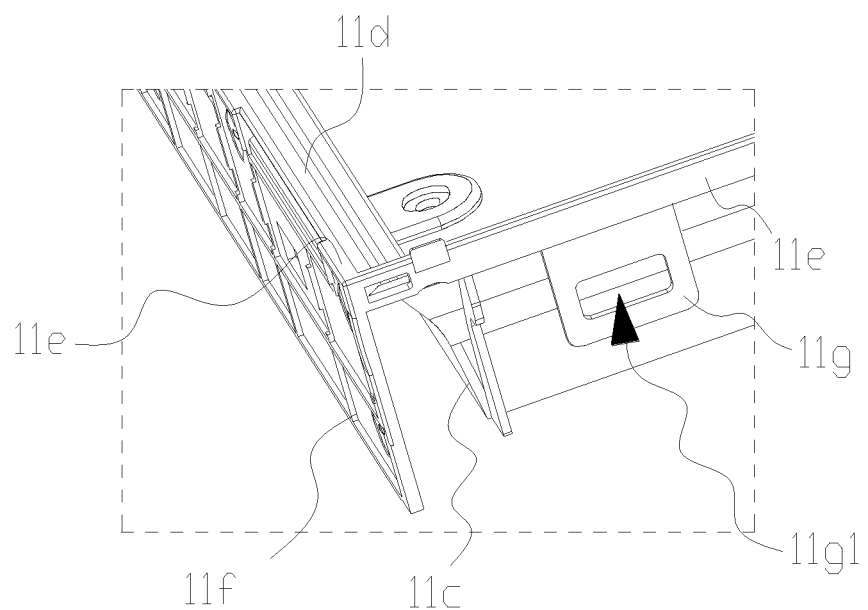
FIG. 8 is an enlarged view of part C in FIG. 7.

Referring to FIGS. 2, 7, and 8, the support frame 112 comprises a second surrounding wall 11c, a support plate 11d, a third surrounding wall 11e, and a connecting wall 11f. The second surrounding wall 11c is arranged inside and along a periphery of the receiving chamber rn. The support plate 11d is protrudingly disposed on an opposite side of the second surrounding wall 11c. The third surrounding wall 11e surrounds around the support plate 11d and is disposed on the first surrounding wall 11b. The connecting wall 11f is arranged corresponding to the bonding area NA2 and extends from the third surrounding wall 11e toward the base 11a. The connecting wall 11f is located outside the first surrounding wall 11b.

The second surrounding wall 11c is engaged with the first surrounding wall 11b. The connecting wall 11f is engaged with the first surrounding wall 11b. Such configuration realizes the connection between the support frame 112 and the backplate 111, and improves the convenience and stability of the connection between the support frame 112 and the backplate 111.

Optionally, in the display device 1000, the second surrounding wall 11c comprises a first wall 11c1 and a second wall 11c2 disposed opposite to each other. The first wall 11c1 is located on one side away from the bonding area NA2. The first wall 11c1, the first surrounding wall 11b, and the support plate 11d define a first space s1.

The second wall 11c2, the first surrounding wall 11b and the support plate 11d define a second space s2.

The first space s1 and the second space s2 facilitate heat dissipation of the backlight module 11 on the one hand, and facilitates installing electrical components and the like in the first space s1 and/or the second space s2 on the other hand. Optionally, engagement lugs 11g are disposed on a third wall 11c3 and a fourth side wall 11c4. The engagement lug 11g is provided with an engagement slot 11g1. The engagement lug 11g is arranged in the engagement groove 11b1 of the backplate 111, and the engagement block 11b2 is engaged inside the engagement slot 11g1.

Optionally, the second surrounding wall 11c further comprises the third wall 11c3 and the fourth wall 11c4 that are arranged opposite to each other. The third wall 11c3 is connected at one side of the first wall 11c1 and the second wall 11c2. The fourth wall 11c4 is connected at another side of the first wall 11c1 and the second wall 11c2. The third wall 11c3 and the fourth wall 11c4 are engaged with the first surrounding wall 11b, so as to realize the detachable connection between the backplate 111 and the support frame 112.

Optionally, the backlight module 11 further comprises a light source 113, a diffuser plate 114, and an optical film 115. The light source 113 is arranged in the receiving chamber rn.

The support plate 11d and the third surrounding wall 11e are connected to form a receiving groove fz. The diffuser plate 114 is disposed in the receiving groove fz. The optical film 115 is disposed on the third surrounding wall 11e and is located on a light emitting side of the diffuser plate 114. Such configuration reasonably arranges optical components and improves a utilization rate of space.

In some embodiments, the backlight module 11 can also comprise the light source 113, a light guide plate, and the optical film 115. The light source 113 is arranged on one side of the receiving chamber rn. The light guide plate is arranged in the receiving chamber rn and located on the light emitting side of the light source. The optical film 115 is disposed on the light guide plate.

In other words, the backlight module 11 can be an edge-lit backlight or a direct-lit backlight. The present application takes the direct-lit backlight as an example for description, but the present application is not limited in this regard.

The splicing display device of the present application comprises at least two display devices, a middle frame, and an LED substrate. Each two adjacent display devices are spliced to form a gap. Each display device comprises a backlight module and a panel arranged on the backlight module. The middle frame comprises a carrying part and a fixing part connected to the carrying part. The carrying part is arranged on two adjacent panels and covers the gap. The fixing part is arranged in the gap and is detachably connected to the backlight module. The LED substrate is disposed on the carrying part.

That is to say, the present application not only uses the middle frame to protect the panel, but also uses the middle frame as a base for supporting the LED substrate. The middle frame and the backplate of the display device are detachably connected, the LED substrate is also arranged on the carrying part of the middle frame. Therefore, by just detaching the middle frame, the LED substrate can be separated from the panel at the same time, which reduces the difficulty in detaching the LED substrate.

The above is a detailed description to the splicing display device of the present application. Specific examples are used in the present disclosure to illustrate working principles and embodiments of the present application. The descriptions of the above embodiments are only used for ease of understanding the present application. Those skilled in the art can modify the embodiments and the application range according to the ideas of the present application. In conclusion, the contents of the specification should not be construed as a limitation to the present application.

What is claimed is:

1. A splicing display device, comprising:
at least two display devices, wherein two adjacent display devices are spliced to form a gap, and each of the display devices comprises a backplate, a panel disposed on the backplate, and a backlight module arranged on a light incident side of the panel, wherein the backplate comprises a base and a first surrounding wall connected on a periphery of the base, the base and the first surrounding wall define a receiving chamber, a limiting recess and a first hole are defined in the first surrounding wall, and the first hole is defined in a bottom of the limiting recess;
a middle frame, wherein the middle frame comprises a carrying part and a fixing part connected to the carrying part, the carrying part is arranged on two adjacent panels and covers the gap, and the fixing part is arranged in the gap and detachably connected to the backplate, wherein the fixing part comprises a plate body and a groove body protruding from the plate body, a second hole is defined in the groove body, the groove body is disposed in the limiting recess, the groove body and the backplate are detachably connected by a connection element, and the connection element is inserted through the first hole and the second hole;
a light emitting diode (LED) substrate, wherein the LED substrate is arranged on the carrying part; and
a flexible circuit board, wherein the flexible circuit board is connected to one side of the LED substrate facing the gap, an opening is defined in the carrying part, and the flexible circuit board passes through the opening and is disposed in the gap,
wherein the panel comprises a display area and a non-display area disposed on a periphery of the display area, and the non-display area comprises a non-bonding area and a bonding area for bonding the flexible circuit board;
the carrying part comprises a first portion and a second portion, the first portion is arranged in the bonding area, the second portion is arranged in the non-bonding area, and a width of the first portion is greater than a width of the second portion;
wherein the backlight module comprises the backplate and a support frame, the support frame is arranged in the receiving chamber, and the support frame is fixedly connected to the backplate;
the support frame comprises a second surrounding wall, a support plate, a third surrounding wall, and a connecting wall, the second surrounding wall is arranged inside and along a periphery of the receiving chamber, the support plate is protrudingly disposed on an opposite side of the second surrounding wall, the third surrounding wall surrounds around the support plate and arranged on the first surrounding wall, the connecting wall is disposed corresponding to the bonding area and extends from the third surrounding wall to the base, and the connecting wall is located on an outer side with respect to the first surrounding wall; and the second surrounding wall is engaged with the first surrounding wall, and the connecting wall is engaged with the first surrounding wall.

2. The splicing display device according to claim 1, wherein the opening is defined in the first portion, and the flexible circuit board is located on one side of the fixing part close to the bonding area.

3. The splicing display device according to claim 1, wherein the connection element comprises a nut and a stud connected to the nut, the nut is arranged in a recessed groove defined by the groove body, and the stud is threadedly connected to the first hole.

4. The splicing display device according to claim 1, wherein the panel is disposed in the receiving chamber of the backplate, and the panel is an LED panel.

5. The splicing display device according to claim 1, wherein the second surrounding wall comprises a first wall and a second wall that are arranged opposite to each other, and the first wall is located on one side away from the bonding area, and the first wall, the first surrounding wall, and the support plate define a first space; and the second wall, the first surrounding wall, and the support plate define a second space.

6. The splicing display device according to claim 5, wherein the second surrounding wall further comprises a third wall and a fourth wall that are arranged opposite to each other, and the third wall is connected at one side of the first wall, the fourth wall is connected at another side of the first wall and the second wall, and the third wall and the fourth wall are engaged with the first surrounding wall.

7. The splicing display device according to claim 5, wherein the backlight module further comprises a light source, a diffuser plate, and an optical film, and the light source is arranged in the receiving chamber; and the support plate and the third surrounding wall are connected to form a receiving groove, the diffuser plate is disposed in the receiving groove, and the optical film is disposed on the third surrounding wall and located on a light emitting side of the diffuser plate.

8. The splicing display device according to claim 1, wherein a thickness of the carrying part is less than a thickness of the fixing part.

9. The splicing display device according to claim 1, wherein the LED substrate shields the carrying part, and an edge portion of the LED substrate protrudes beyond the carrying part.

* * * * *